(12) United States Patent
Sawada et al.

(10) Patent No.: US 6,169,317 B1
(45) Date of Patent: *Jan. 2, 2001

(54) PHOTOELECTRIC CONVERSION DEVICE AND IMAGE SENSOR

(75) Inventors: Koji Sawada, Atsugi; Hiraku Kozuka, Hiratsuka; Shigeru Nishimura, Ebina, all of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/247,950

(22) Filed: Feb. 11, 1999

(30) Foreign Application Priority Data

Feb. 13, 1998 (JP) .................................. 10-031223

(51) Int. Cl.⁷ .............................................. H01L 31/0232
(52) U.S. Cl. ............................................ 257/435; 257/292
(58) Field of Search .................................. 257/435, 292, 257/649

(56) References Cited

U.S. PATENT DOCUMENTS

| | | | |
|---|---|---|---|
| 4,578,693 | 3/1986 | Yazawa et al. | 357/30 |
| 4,743,955 | 5/1988 | Matsumoto | 357/30 |
| 4,972,243 | 11/1990 | Mizutani et al. | 357/30 |
| 5,081,347 | 1/1992 | Matsumoto | 250/211 |
| 5,124,544 | 6/1992 | Ohzu | 250/211 |
| 5,159,186 | 10/1992 | Ohzu | 250/208 |
| 5,506,430 | 3/1996 | Ohzu | 257/292 |
| 5,514,888 | * 5/1996 | Sano et al. | |
| 5,929,470 | * 7/1999 | Harada et al. | 257/233 |

FOREIGN PATENT DOCUMENTS 0 557 098 A1 * 2/1993 (EP).
0 590 598 A1 * 9/1993 (EP).

OTHER PUBLICATIONS

Chye Huat Aw, et al., "A 128x128–Pixel Standard–CMOS Image Sensor with Electronic Shutter", Paper FA 11.2, Session 11, IEEE International Solid State Circuits Conference (XP002914009), pp. 180–181.*

* cited by examiner

Primary Examiner—Ngân V. Ngô
(74) Attorney, Agent, or Firm—Fitzpatrick, Cella, Harper & Scinto

(57) ABSTRACT

To make the thickness of an interlevel insulating film uniform and suppress variations in output signal, in a photoelectric conversion element including a plurality of photoelectric conversion portions, and light-shielding units having openings formed above the photoelectric conversion portions, the light-shielding units have first light-shielding layers, and second light-shielding layers formed on the first light-shielding layers via an interlevel insulating film. The first light-shielding layers have gaps (GP) for allowing two adjacent openings (OP) to communicate with each other. The second light-shielding layers have light-shielding portions (12a) above the gaps of the first light-shielding layers.

20 Claims, 13 Drawing Sheets

PHOTOELECTRIC CONVERSION DEVICE AND IMAGE SENSOR

BACKGROUND OF THE INVENTION

1. Field of the Invention

The present invention relates to an image sensor used for an image scanner, facsimile device, video camera, digital camera, and the like, and a photoelectric conversion device (element) constituted by the image sensor.

2. Related Background Art

Amplifier and non-amplifier type solid-state image sensors using a charge coupled device (CCD), phototransistor, and photodiode are widely used as line and area sensors serving as electronic eyes of information devices such as the image scanner.

In a photoelectric conversion element in which a photoelectric conversion portion (light-receiving element) and a peripheral circuit such as a signal transfer portion are fabricated on a single substrate, the light-receiving element has a multilayered structure formed from an interlevel insulating film, protective film, and the like. If these layers are made of different materials, they exhibit different diffractive indices to cause multiple interference of light. The spectral sensitivity of the multilayered structure is examined to find a ripple. As a result, even a slight wavelength difference may greatly change the sensitivity of the photoelectric conversion element.

Variations in thickness of the multilayered film on the light-receiving element change the spectral sensitivity in accordance with the film thickness, thereby varying the sensitivity with respect to a given wavelength. This means that the sensitivity with respect to a certain wavelength varies within one chip in a photoelectric conversion element constituted by aligning a plurality of light-receiving elements.

A technique for making the film thickness on the light-receiving element uniform is disclosed in Japanese Patent Application Laid-Open No. 9-55488. FIG. 15 shows a section of a conventional photoelectric conversion element. A light-receiving element 2, a first polysilicon gate layer 3, a second polysilicon gate layer 4, a light-shielding layer 5, and a protective film 6 are formed on a substrate 1. A planarization layer 7 is formed on the resultant structure. In this element, an on-chip lens 9 and a color filter 8 are formed on the planarization layer.

This planarization layer 7 is formed by forming a precursor planarization layer of an insulating material and removing unevenness by chemical mechanical polishing (CMP). In the CMP process, the running costs of an abrasive and polishing pad are high. Further, cleaning must be precisely performed after polishing in order to remove an alkaline abrasive used for polishing and polishing dust produced by polishing. The CMP process therefore requires very high cost.

To form a flat insulating film on a light-shielding layer without any CMP process, a coating insulating film was employed.

The light-shielding layer, however, functioned as a coating barrier, which made the thickness of the coating insulating film different between light-receiving elements on the same chip.

For example, as shown in FIG. 16, when the position of the light-receiving element is determined by openings OP defined by the light-shielding layer 5, the light-shielding layer 5 is interposed between adjacent openings, so the precursor material of the coating insulating film is difficult to flow over the light-shielding layer. Accordingly, a coating insulating film on a light-receiving element near the center in the photoelectric conversion element and a film on a light-receiving element near the end of the element may be different in thickness. This difference becomes larger on a single wafer for forming a plurality of photoelectric conversion elements. In the following case, this film thickness difference appears conspicuously as characteristics of the photoelectric conversion element.

In an image sensor in which a photoelectric conversion element having many aligned light-receiving elements is arranged on a substrate, an original is illuminated to read a color image by sequentially switching three, red, green, and blue LEDs as a light source in time-series. In this case, even if the total thickness of a multilayered film on the light-receiving element is uniform, different thicknesses of respective films vary the spectral sensitivity to change the sensitivity distribution curve at each wavelength, failing to obtain a correct image.

SUMMARY OF THE INVENTION

It is an object of the present invention to provide a photoelectric conversion element and image sensor in which a light-shielding layer does not become a coating barrier, and the thickness of a coating insulating film hardly varies between light-receiving elements on a single chip.

According to the present invention, there is provided a photoelectric conversion element comprising a plurality of photoelectric conversion portions, and light-shielding means having openings formed above the photoelectric conversion portions, the light-shielding means having first light-shielding layers, and second light-shielding layers formed on the first light-shielding layers via an interlevel insulating film, the first light-shielding layers having gaps for allowing two adjacent openings to communicate with each other, and the second light-shielding layers having light-shielding portions above the gaps of the first light-shielding layers.

DETAILED DESCRIPTION OF THE PREFERRED EMBODIMENTS

FIGS. 1A to 1E show a photoelectric conversion device and its building components according to an embodiment of the present invention.

Figure 1A:
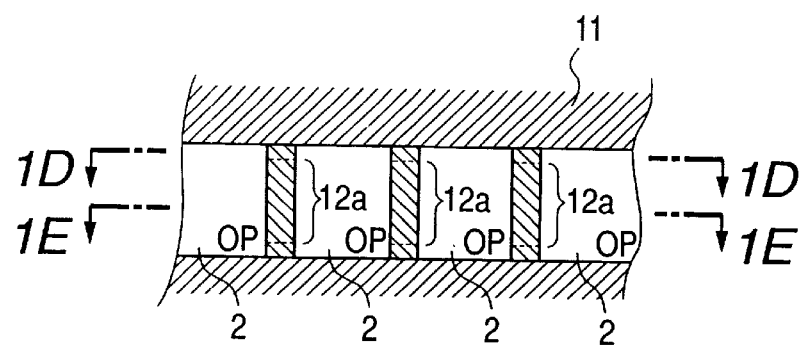
FIGS. 1A, 1B, 1C, 1D and 1E are schematic views for explaining the structure of a photoelectric conversion element according to the present invention.
Figure 1B:
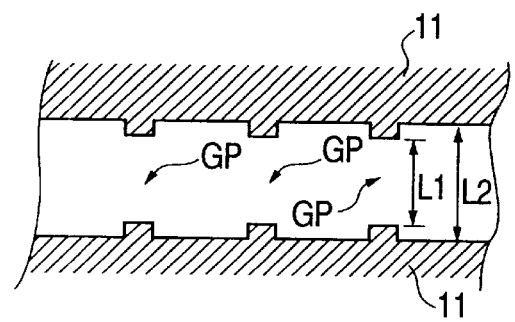
Figure 1C:
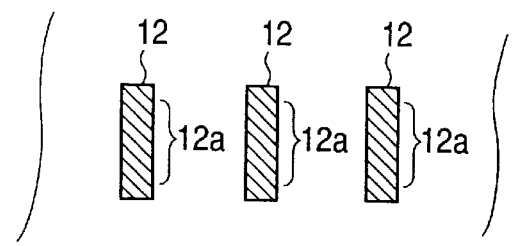
Figure 1D:
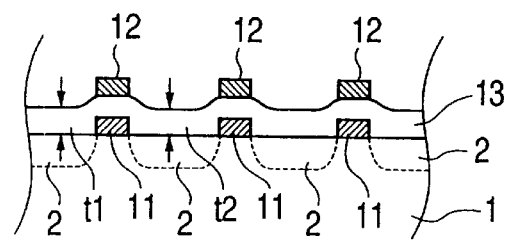
Figure 1E:
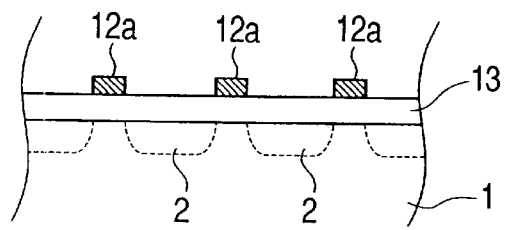

FIG. 1A shows the top of the element, FIG. 1B shows a first light-receiving layer, Fig. 1C shows a second light-receiving layer, FIG. 1D shows a section taken along the line 1D—1D in FIG. 1A, and FIG. 1E shows a section taken along the line 1E—1E in FIG. 1A.

As shown in FIGS. 1A and 1B, a plurality of photoelectric conversion portions (light-receiving elements) 2 are formed on a substrate 1. First and second light-shielding layers 11 and 12 serving as a light-shielding unit are formed above the substrate 1.

As shown in FIG. 1A, the light-shielding unit has openings OP for passing light onto the light-receiving elements 2.

As shown in FIG. 1B, the first light-shielding layers 11 have gaps GP at a length L1 for allowing adjacent openings OP to communicate with each other in at least the opening alignment direction.

As shown in FIGS. 1A, 1C, and 1E, light-shielding portions 12a of the second light-shielding layers are formed on the gaps GP of the first light-shielding layers 11 via an interlevel insulating film (interlayer dielectric) 13 so as to cover the gaps GP.

According to the photoelectric conversion element of this embodiment, since the first light-shielding layers 11 have the gaps GP between light-receiving elements, a precursor forming the interlevel insulating film flows through these gaps. Therefore, as shown in FIGS. 1D and 1E, variations in thickness of the interlevel insulating film 13 are suppressed between light-receiving elements, and the film thickness becomes uniform.

To prevent light from being incident on the substrate 1 via each gap GP, the light-shielding portion 12a of the second light-shielding layer 12 is formed on the gap GP.

If openings OP are formed independently of each other without any gap between the first light-shielding layers 11, light-receiving elements have a section shown in FIG. 1D at any portion between them. The flow of the precursor is obstructed to make thicknesses t1 and t2 different.

An example of the light-receiving element 2 used in the present invention is a photodiode or phototransistor having a Schottky junction, MIS junction, pn junction, or pin junction. If necessary, light-receiving elements are isolated electrically or physically by element isolation regions.

The light-shielding layers 11 and 12 used in the present invention are made of a pure metal, alloy, silicide, or the like. More specifically, they are formed from a conductor made of a single layer or multilayered structure of Al, AlSi, AlSiCu, AlCu, Cr, Mo, W, WN, Ta, TaN, Ti, TiN, and the like.

As the interlevel insulating film used in the present invention, a coating insulating film using a fluid precursor planarization material such as inorganic or organic SOG is preferably employed. As needed, the interlevel insulating film may be a multilayered film in combination with an insulating film deposited by CVD.

Further, a protective film (passivation film) made of, e.g., silicon nitride may be formed on the second light-shielding layer 12 to cover it.

The gap length L1 of the light-shielding layer 11 is preferably 1/3 or more of a side length L2 of the opening OP, and more preferably 1/3 or more to 3/3 or less.

Figure 2:
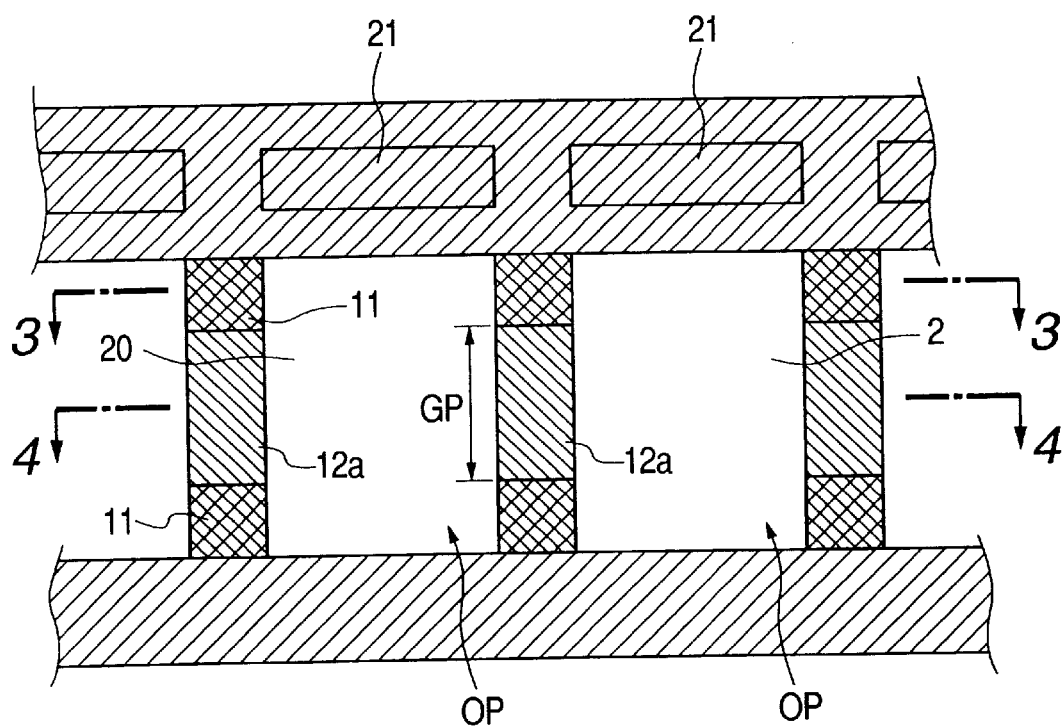
FIG. 2 is a plan view of the photoelectric conversion element according to the present invention.
Figure 3:
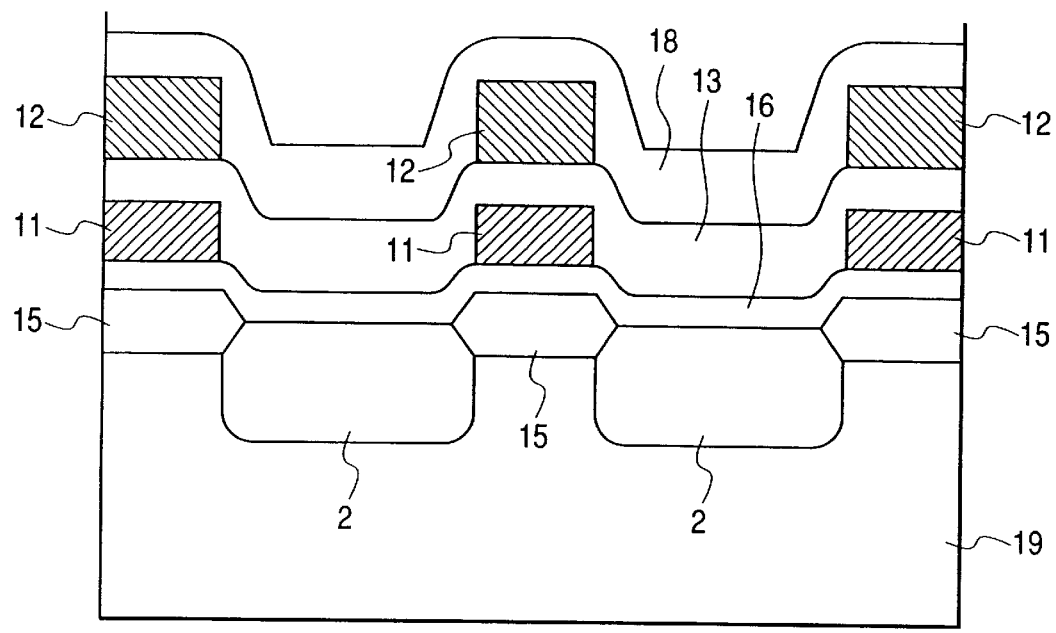
FIG. 3 is a sectional view of the photoelectric conversion element taken along the line 3—3 in FIG. 2.
Figure 4:
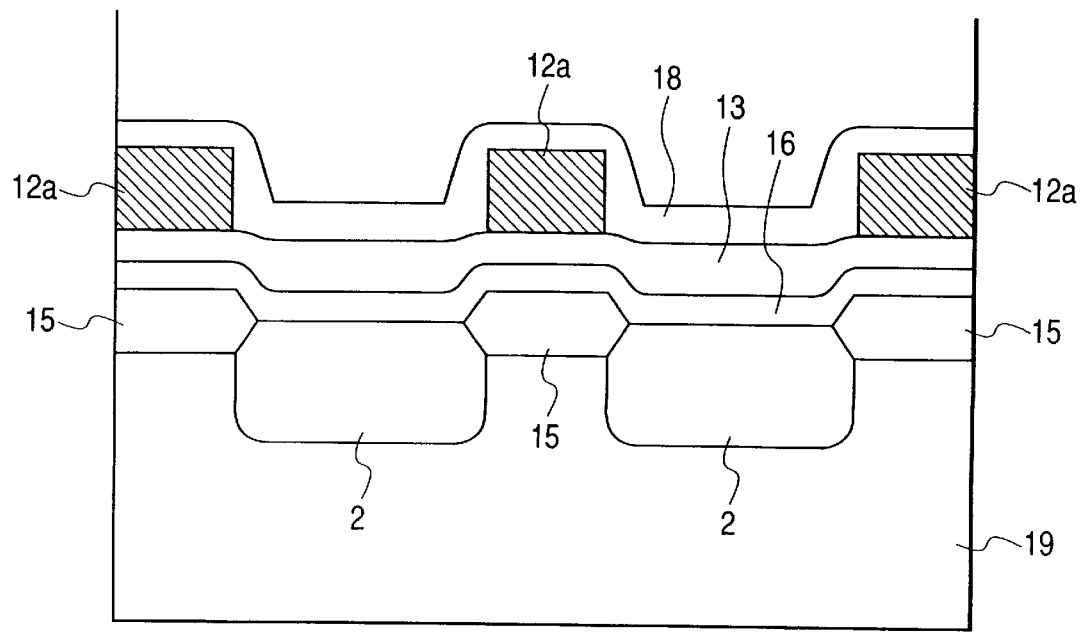
FIG. 4 is a sectional view of the photoelectric conversion element taken along the line 4—4 in FIG. 2.

FIG. 2 is a plan view of another photoelectric conversion element according to the present invention. FIG. 3 is a sectional view taken along the line 3—3 in FIG. 2. FIG. 4 is a sectional view taken along the line 4—4 in FIG. 2.

As shown in FIG. 2, the photoelectric conversion element comprises a light-shielding unit having openings OP on light-receiving elements 2.

As shown in FIGS. 3 and 4, element isolation regions 15 made of an insulating material prepared by selective oxidization, and light-receiving elements 2 between them are formed on the upper surface of a semiconductor substrate 19 such as an Si substrate.

An insulating film 16 for insulating a polysilicon gate electrode and an interconnection formed on it (neither is shown) is formed on the upper surface of the semiconductor substrate 19. The insulating film 16 is made of a silicon oxide film undoped or doped with boron (B) or phosphorus (P).

First light-shielding layers 11 are made of, e.g., Al by sputtering or the like on the surface of the insulating film 16, as described above. The planar pattern of the first light-shielding layer 11 has gaps GP between the openings OP, as shown in FIG. 2. A conductor serving as the first light-shielding layer 11 may form part of an interconnection of the photoelectric conversion element.

An interlevel insulating film 13 is formed on the first light-shielding layer 11.

Silicon oxide excellent in step coverage is deposited to about 300 nm to 500 nm by plasma CVD. SOG is spin-coated, annealed, and then etched back to form a silicon oxide film (coating interlevel insulating film) 100 nm to 400 nm in thickness. Silicon oxide is deposited to 300 nm to 500 nm on the silicon oxide film by plasma CVD, thereby completing the interlevel insulating film 13.

During SOG spin coating, since the precursor flows onto an adjacent light-receiving element via the gap GP of the first light-shielding layer 11, it flows smoothly without staying at one light-receiving element 2, and thus the uniformness of the film thickness improves.

Second light-shielding layers 12 are formed on the interlevel insulating film 13 to cover the gaps GP of the first light-shielding layers 11.

Light-shielding portions 12a of the second light-shielding layers 12 prevent light from being incident between light-receiving elements.

A protective film 18 for preventing entrance of water, alkaline ions, and the like is formed on the second light-shielding layers 12. This protective film is made of, e.g., silicon nitride deposited by plasma CVD.

As described above, the light-shielding unit is constructed from a plurality of light-shielding layers 11 and 12 in different patterns. The first light-shielding layers 11 serving as underlayers of the coating insulating film have gaps between adjacent light-receiving elements 2 to make the thickness of the insulating film uniform. The light-shielding unit shields the main part of at least a peripheral circuit 21 from light.

An example of a peripheral circuit corresponding to one pixel used in the photoelectric conversion element of the present invention will be explained with reference to FIG. 5.

The anode of a photodiode constituting each light-receiving element 2 is connected to a reset unit 51 and the gate of a pMOS transistor 53 of a source follower amplifier forming an amplifier portion 52.

The cathode of the diode and a pMOS transistor 53' serving as the load of the source follower amplifier are connected to a high-potential reference voltage source.

When a transfer nMOS transistor 54 is turned on, an amplified light signal is transferred and temporarily stored in a storage capacitor 55.

Since the storage capacitor 55 is connected to the gate of a pMOS transistor 56 of the source follower amplifier, an output from the source follower is amplified depending on voltage stored in the storage capacitor. The nMOS transistor 54, the storage capacitor 55, the pMOS transistor 56 serving as the source follower amplifier, and a load pMOS transistor 56' realize a signal retaining unit.

An output from the signal retaining unit is connected to a noise reduction unit.

The noise reduction unit is constituted by a pair of sampling circuits, one of which is made up of a noise transfer nMOS transistor 57, a noise retaining capacitor 59, a reset nMOS transistor 61, and a scanning transistor 64'.

The other sampling circuit is made up of a light signal transfer nMOS transistor 58, a light signal retaining capacitor 60, a reset nMOS transistor 62, and a scanning transistor 64.

Figure 5:
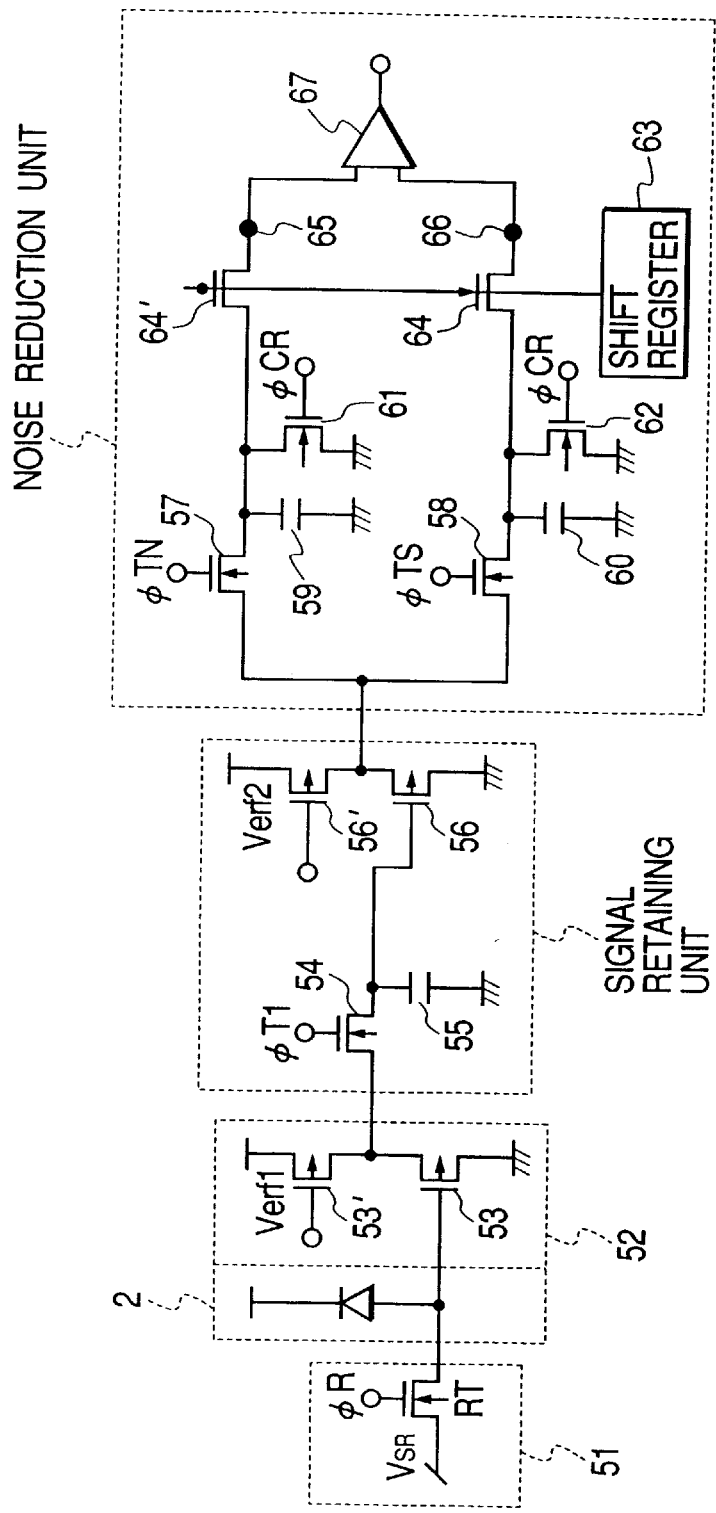
FIG. 5 is a circuit diagram of part of the photoelectric conversion element according to the present invention.
Figure 6:
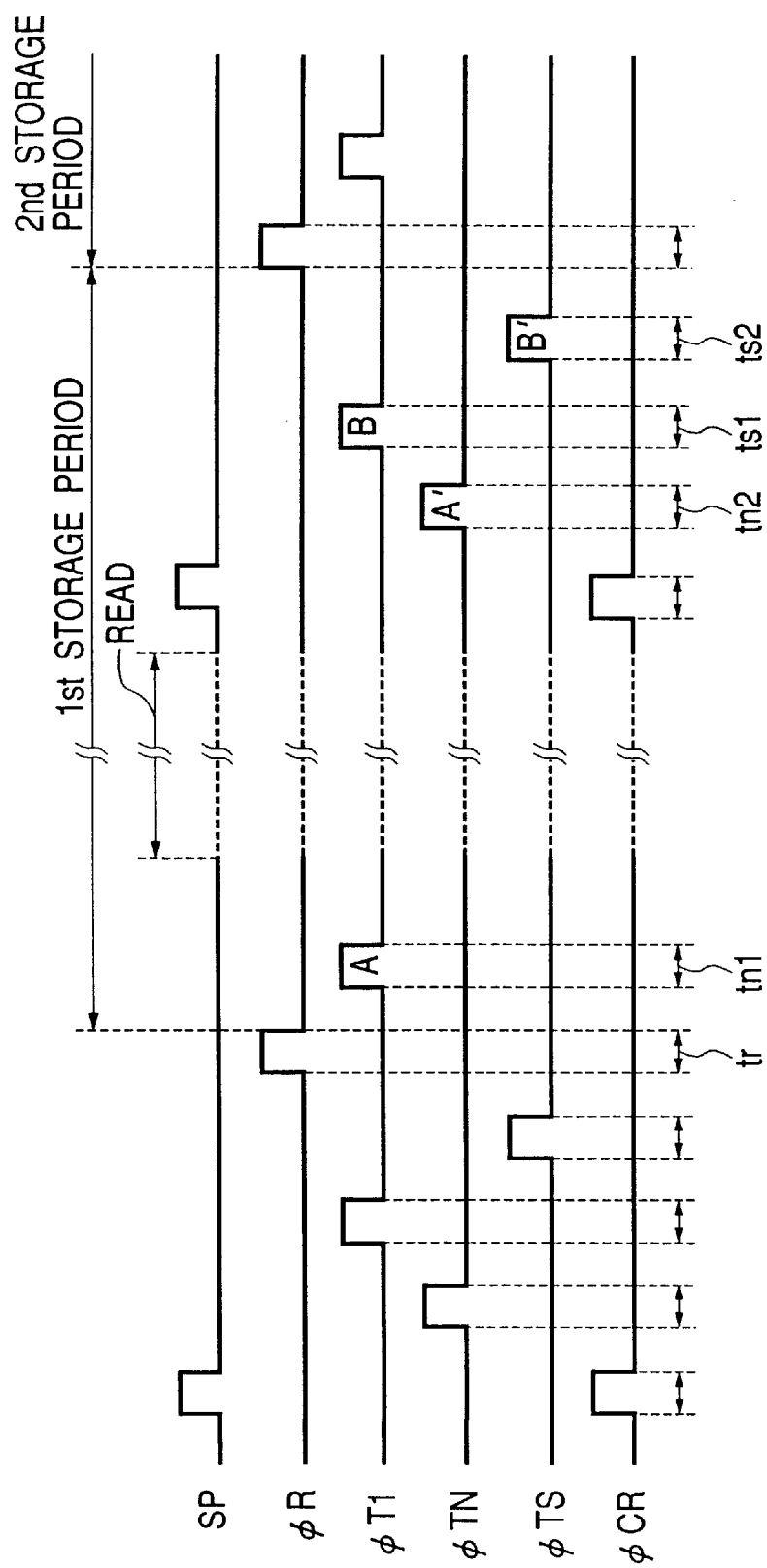
FIG. 6 is a timing chart showing the operational timing of the photoelectric conversion element according to the present invention.

FIG. 6 is a timing chart for explaining operation of the circuit in FIG. 5. In accordance with input of a start pulse SP, a high-level pulse is input to gate terminals $\phi$CR of the reset nMOS transistors 61 and 62 to reset the noise and light signal retaining capacitors 59 and 60 to a low-potential (ground-level) reference voltage.

A high-level pulse is input to a terminal $\phi$TN to turn on the noise transfer nMOS transistor 57 and read to the noise retaining capacitor 59 an output voltage amplified in accordance with voltage stored in the capacitor 55. This output voltage is a noise voltage immediately after the photoelectric conversion portion 2 is reset in the previous field.

A high-level pulse is input to a terminal $\phi$T1 to turn on the transfer nMOS transistor 54 and read the output voltage from the amplifier portion to the storage capacitor 55. This output voltage is a light signal voltage in the current field.

Subsequently, a high-level pulse is input to a terminal $\phi$TS to turn on the light signal transfer nMOS transistor 58 and to read and retain the light signal to and in the capacitor 60.

A high-level pulse is input to a terminal $\phi$R to turn on a reset nMOS transistor RT, connect the anode of the photodiode to a reset reference voltage source $V_{SR}$, and reset the anode to a reset potential (period tr). Then, a high-level pulse is input to the terminal $\phi$T1 to turn on the nMOS transistor 54 and read out, as a noise voltage to the capacitor 55, a voltage component immediately after the photodiode is reset (period tn1).

While the photodiode stores a photocarrier, the voltages retained by the noise and light signal retaining capacitors 59 and 60 are respectively output to common output signal lines 65 and 66 via the scanning transistors 64 and 64'.

The common output signal lines 65 and 66 are connected to a differential circuit 67 where the noise voltage is subtracted from the light signal voltage.

The noise voltage retained in the storage capacitor 55 is transferred to the capacitor 59 upon reception of a high-level pulse at the terminal $\phi$TN again (period tn2). A high-level pulse is input to the terminal $\phi$T1 again to retain a light signal in the storage capacitor (period ts1), and a high-level pulse is input to the terminal $\phi$TS to transfer the light signal to the capacitor 60 (period ts2). In the next storage period, the noise and light signal respectively stored in the capacitors 59 and 60 are sequentially scanned in units of pixels, and differences between them are calculated.

Figure 7:
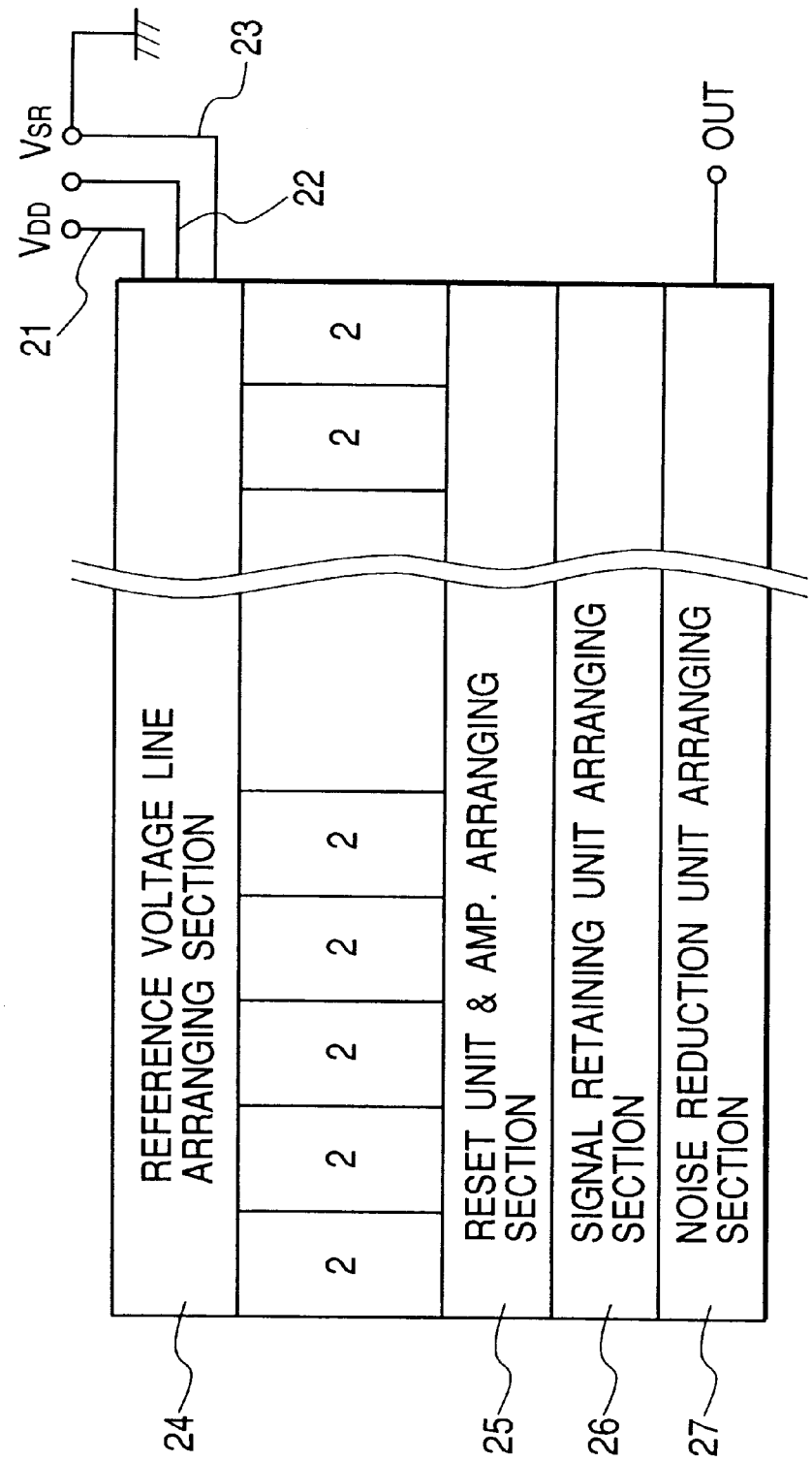
FIG. 7 is a layout view showing the circuit block of the photoelectric conversion element according to the present invention.

FIG. 7 is a view showing an example of the layout of the photoelectric conversion element on the semiconductor chip. Reference voltage lines for applying reference voltages, such as a voltage line 21 at a high potential $V_{DD}$, a reset line 22 at the reset voltage $V_{SR}$, and a ground line 23 at a ground potential, are arranged in a reference voltage line arranging section 24 on one side (upper side in FIG. 7) along the alignment of the light-receiving elements 2.

A reset unit, amplifier portion, signal retaining unit, and noise reduction unit are arranged as peripheral circuits in respective arranging sections 25, 26, and 27 on the other side (lower side in FIG. 7) of the light-receiving element array. Each transistor constituting a peripheral circuit is substantially shielded from light by the second light-shielding layer.

Figure 8:
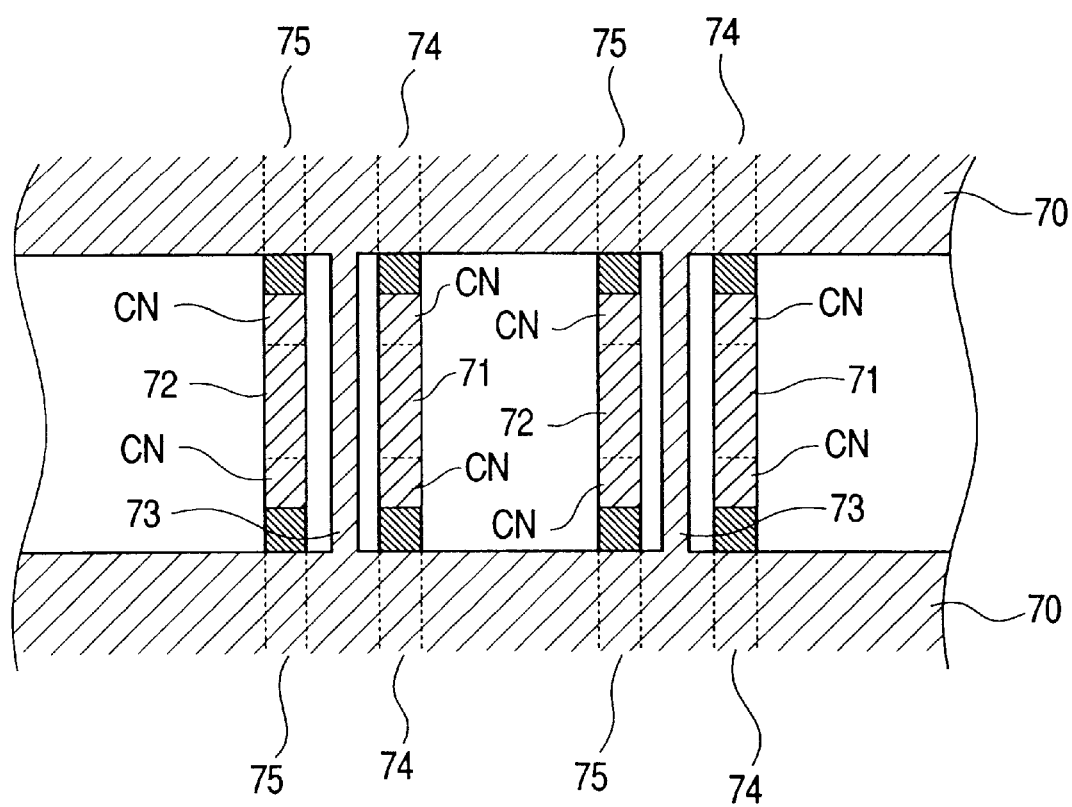
FIG. 8 is a plan view of another photoelectric conversion element according to the present invention.
Figure 9:
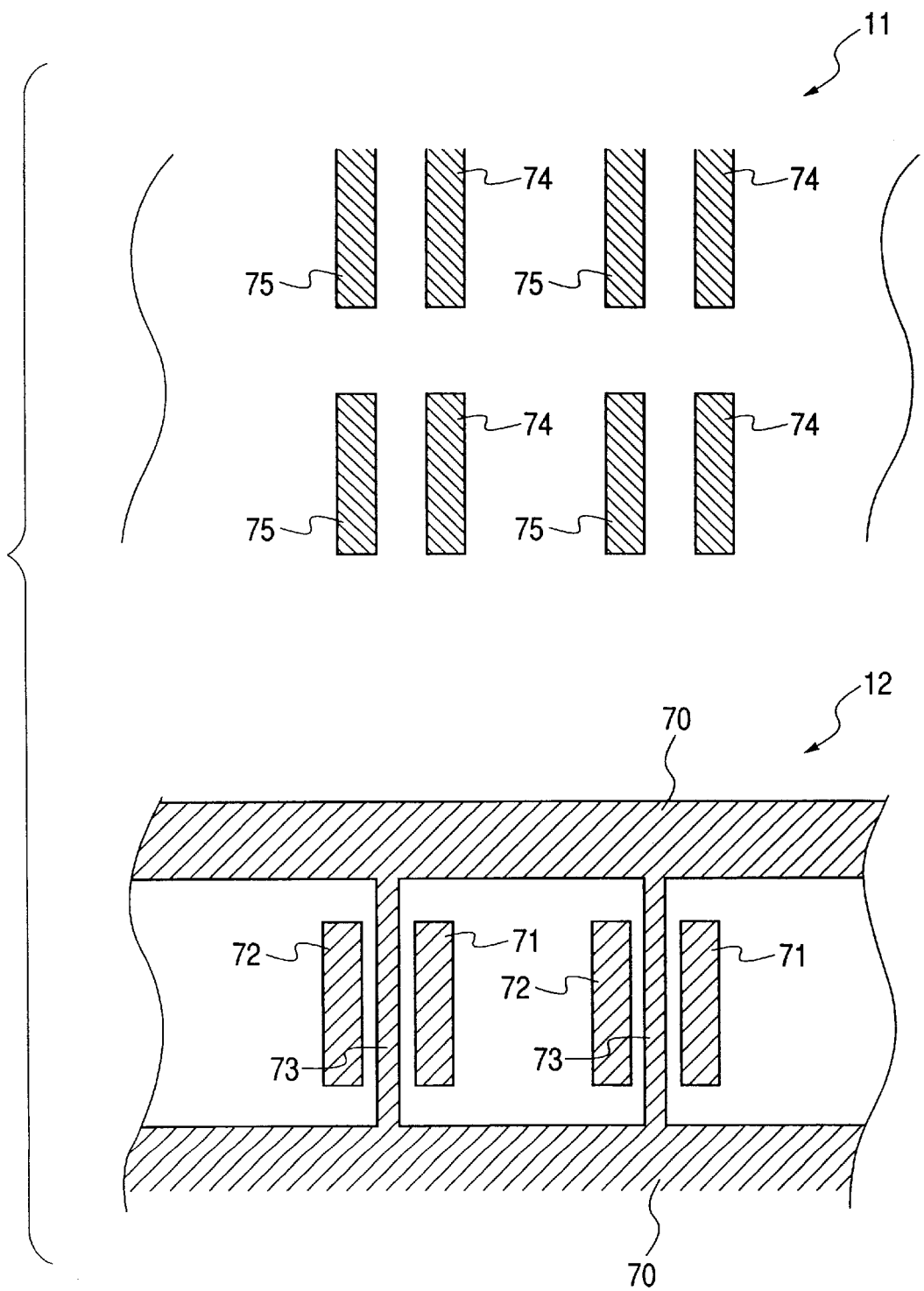
FIG. 9 is a plan view of a light-shielding means used in the photoelectric conversion element according to the present invention.

FIG. 8 is a plan view of another photoelectric conversion element according to the present invention, showing the pattern of a light-shielding unit. FIG. 9 shows the patterns of first and second light-shielding layers in FIG. 8.

First light-shielding layers 74 and 75 serve as interconnections and are, e.g., ground or reset lines.

Second light-shielding layers 70, 71, 72, and 73 are formed on the first light-shielding layers 74 and 75 via a coating insulating film to shield a peripheral circuit from light.

As described above, the first light-shielding layers 74 and 75 are respectively separated into upper and lower portions with gaps each of which is 1/3 or more of the vertical side of an opening.

For this reason, the first light-shielding layers 74 and 75 are respectively connected via contact holes CN formed in the coating insulating film to the second light-shielding layer portions 71 and 72 at positions where they cover the gaps.

In this manner, the peripheral circuit on the lower side in FIG. 7 receives from the upper side in FIG. 7 a ground voltage via the light-shielding portion 72, a high-potential voltage via the layer 70, and a reset voltage via the light-shielding portion 71.

The second light-shielding layer portions 73 are formed between the first light-shielding layers 74 and 75 so as to fill clearances between them and electrically connect them. Although a clearance for passing light is still left between light-receiving elements, this does not pose any serious problem because the underlying portion functions as an element isolation region.

FIG. 9 shows the patterns of first and second light-shielding layers 11 and 12 in FIG. 8.

Figure 10:
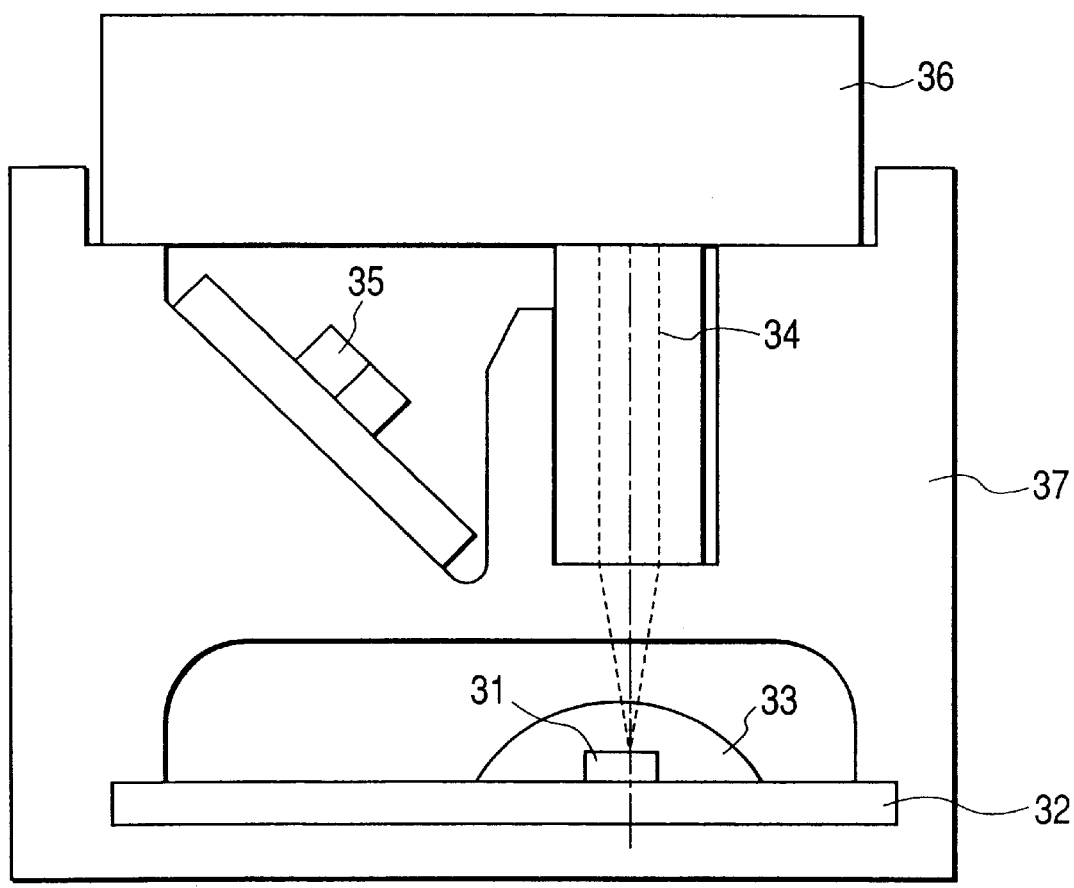
FIG. 10 is a sectional view of an image sensor according to the present invention.

FIG. 10 shows an example of a contact image sensor using the photoelectric conversion element of the present invention. A plurality of photoelectric conversion elements 31 each prepared by linearly aligning a plurality of light-receiving elements are laid out in a line or staggered shape on a ceramic or glass epoxy substrate 32, electrically connected to an interconnection on the glass epoxy substrate 32 by wire bonding, and covered for protection with a chip coating agent 33 made of a silicone resin or the like. The contact image sensor is constituted by assembling the substrate 32, a lens array 34 for focusing light reflected by an original and forming an image on the surface of the light-receiving element, an LED light source 35 for generating red, green, and blue light beams, and an original support 36 formed from a transparent member.

When the LED light source 35 emits only a red light beam, the photoelectric conversion elements 31 are driven to read red information. The red and blue LEDs are turned off, and the green LED is turned on to read green information. Then, only the blue LED is turned on to read blue information. This allows to read a color image of a color original without any color filter.

Figure 11:
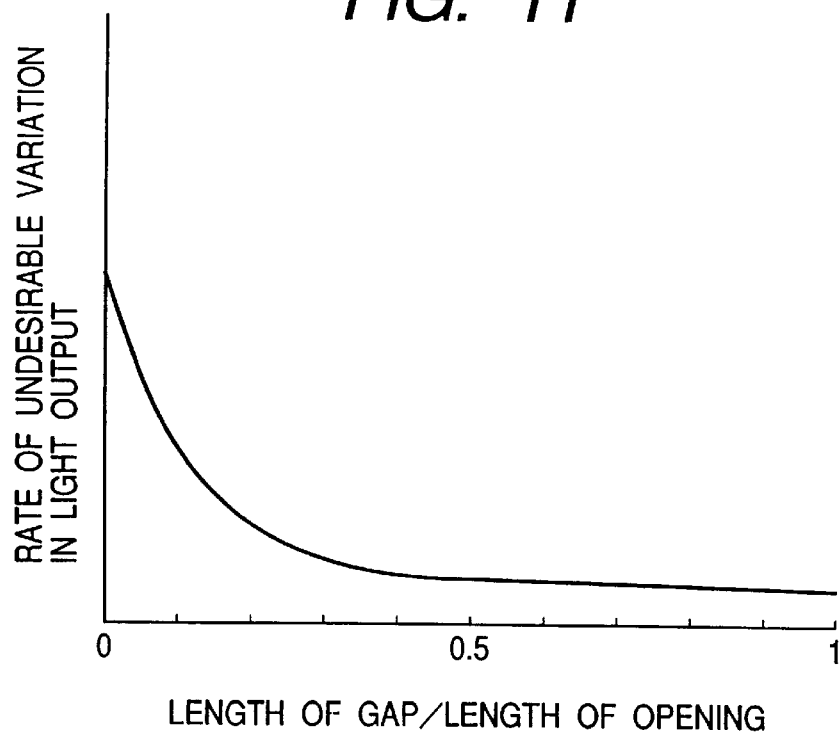
FIG. 11 is a graph showing the length of a gap with respect to the side length of an opening of a light-shielding layer vs. the rate of undesirable variation in light output.

FIG. 11 is a graph showing the ratio of the length of the gap GP of the first light-shielding layer to the side length of the opening vs. the rate of undesirable variation in light output in the photoelectric conversion element for the contact image sensor. The rate of undesirable variation decreases until the rate of the gap reaches 1/3, and hardly changes after that.

The above structure can therefore reduce variations in thickness of the interlevel insulating film, suppress shifts of the spectral sensitivity, and reduce variations in sensitivity.

Figure 12:
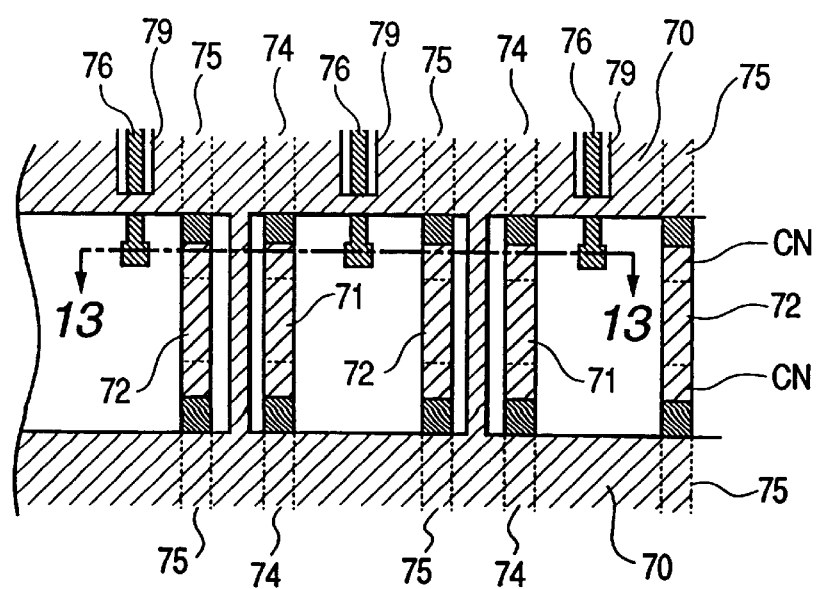
FIG. 12 is a plan view of still another photoelectric conversion element according to the present invention.
Figure 13:
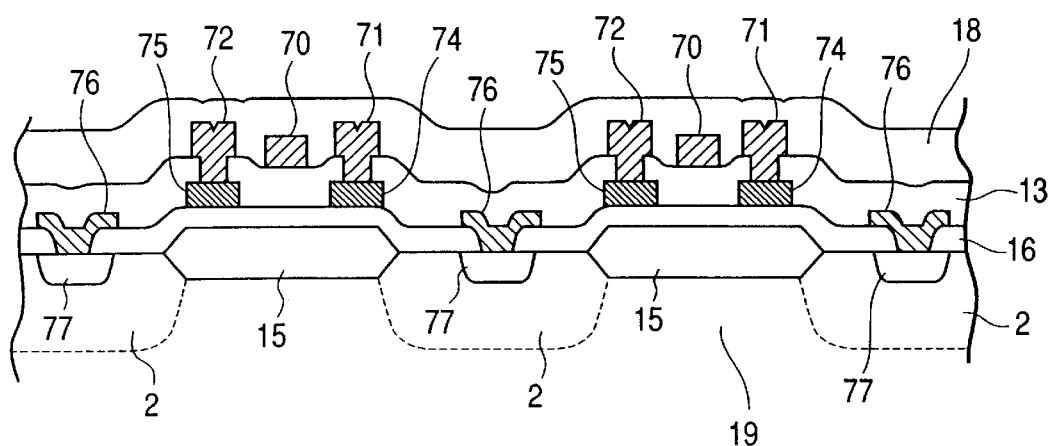
FIG. 13 is a sectional view taken along the line 13—13 in FIG. 12.

FIGS. 12 and 13 respectively show the top and section of a photoelectric conversion element according to still another embodiment of the present invention.

This photoelectric conversion element is different from the element shown in FIG. 8 in that one electrode interconnection 76 of a photodiode extends into an opening.

One semiconductor region 77 serving as an anode or cathode of a photodiode is formed like an island in one opening in the upper surface of a semiconductor substrate 19, and connected via a contact hole in an insulating film 16 to the electrode interconnection 76 made of the same film as first light-shielding layers 74 and 75.

A photoelectric conversion portion (light-receiving element) 2 generates a carrier upon reception of light and functions as a depletion layer.

An element isolation region 15 is formed between light-receiving elements. The first light-shielding layers 74 and 75 and second light-shielding layers 70, 71, and 72 that shield the portion between light-receiving elements from light are formed in the element isolation region 15.

If necessary, a notched portion 79 may be formed in the second light-shielding layer 70, as shown in FIG. 12, in order to reduce the capacitance between the second light-shielding layer 70 and electrode interconnection 76.

Also in this embodiment, the light-shielding unit between light-receiving elements operates as a reference voltage line to reduce the parasitic resistance of the reference voltage line and suppress variations between pixels.

Figure 14:
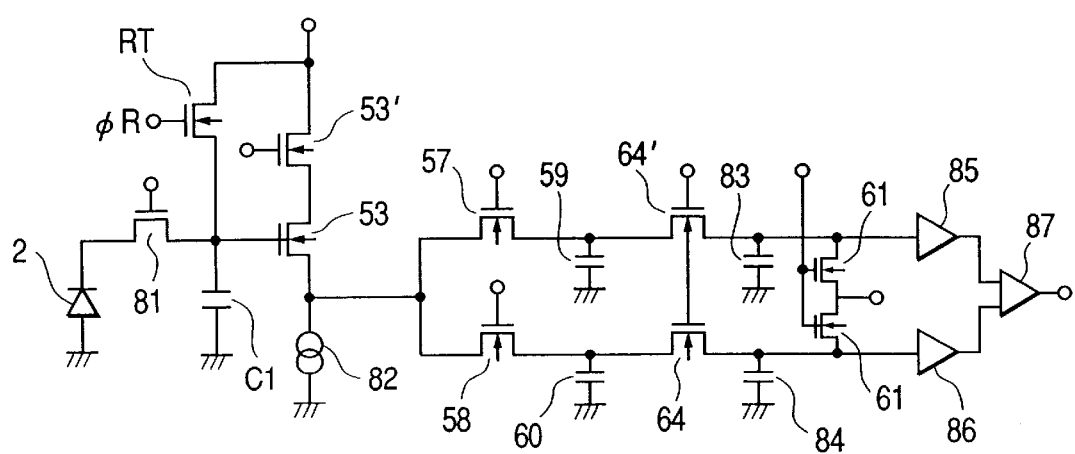
FIG. 14 is a circuit diagram of still another photoelectric conversion element according to the present invention.
Figure 15:
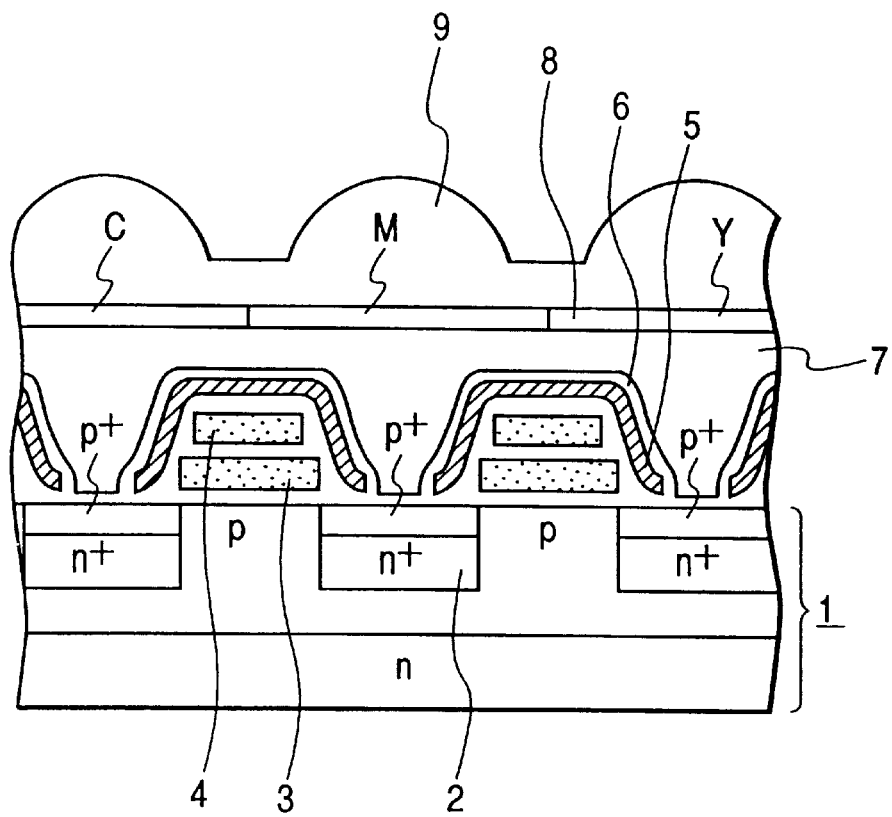
FIG. 15 is a sectional view of a conventional photoelectric conversion element.
Figure 16:
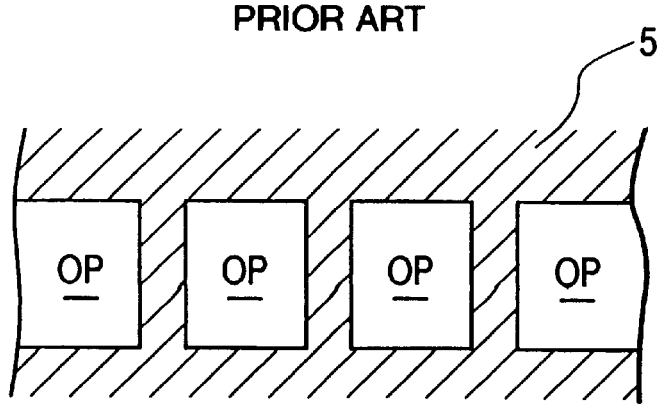
FIG. 16 is a plan view of the photoelectric conversion element.

FIG. 14 is a circuit diagram showing a photoelectric conversion element corresponding to one pixel according to the present invention.

This photoelectric conversion element is different from the element shown in FIG. 5 in that a charge transfer MOS transistor 81 is formed between a photodiode and the gate of a MOS transistor 53, that the signal retaining unit in FIG. 5 is omitted, that output signal lines are simultaneously reset by a pair of MOS transistors 61, and that some MOS transistors have opposite conductivity types.

Figure 17:
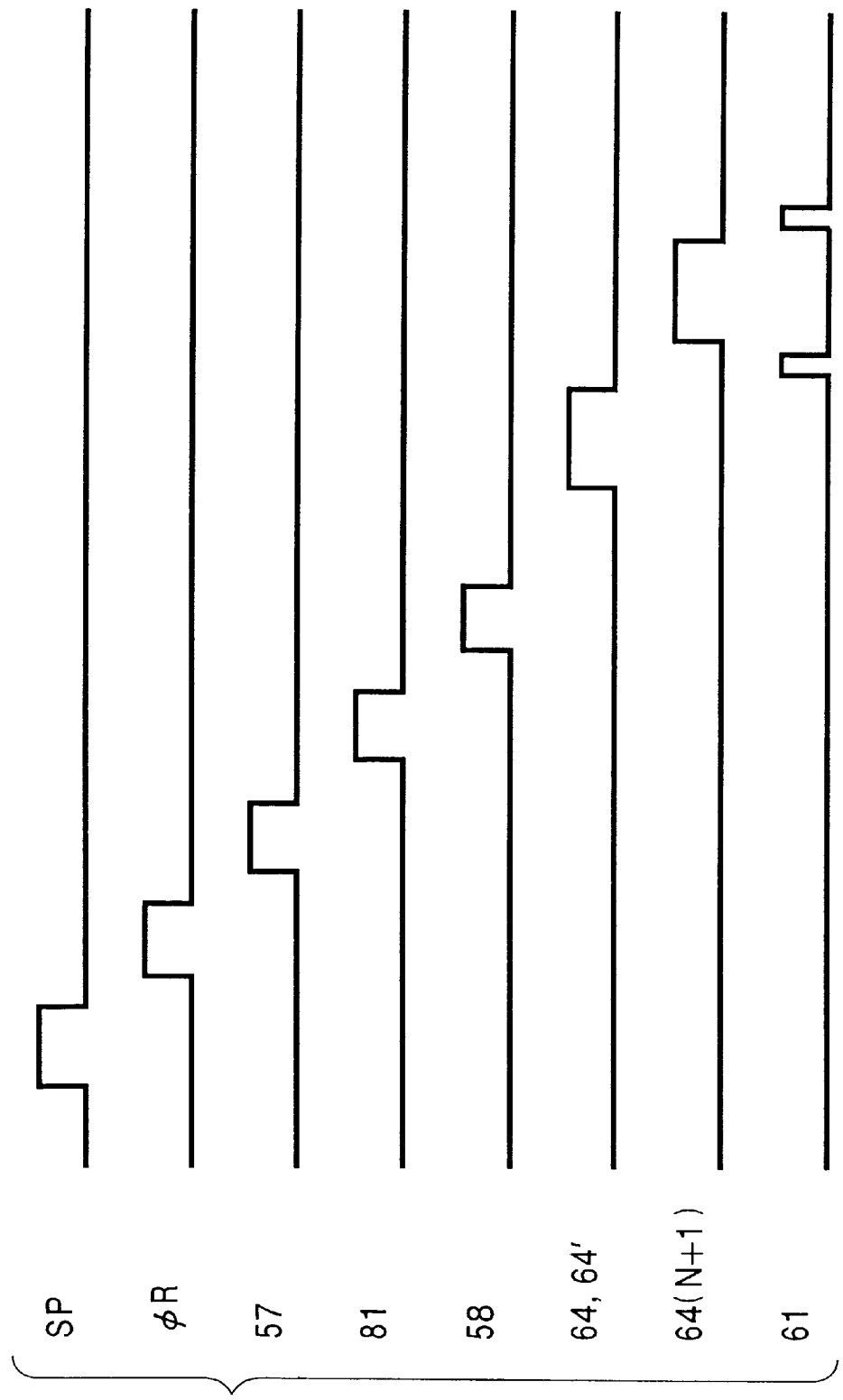
FIG. 17 is a timing chart showing the operational timing of the photoelectric conversion element.

Immediately after reset by an nMOS transistor RT, an nMOS transistor 57 is turned on to store a reset noise component in a capacitor 59 as shown in FIG. 17.

The MOS transistor 81 is turned on to transfer and store a light signal charge stored in the photodiode to the gate of the nMOS transistor 53. An nMOS transistor 58 is turned on to store the amplified light signal from the nMOS transistor 53 in a capacitor 60. A pair of nMOS transistors 64 and 64' are turned on by a horizontal shift register (not shown) to output the difference between the reset noise and light signal components from a differential amplifier 87. Consequently, the light signal from which the reset noise component of one pixel is removed can be obtained. Then, a light signal of a next pixel is output by next transistors 64(N+1), which are not shown in FIG. 14.

In the embodiment of FIGS. 12 to 14, a ground voltage (reset voltage) in each pixel may be applied via the light-shielding layer 72 or 75, and a high-potential reference voltage may be applied via the light-shielding layer 70 or 74.

A method of manufacturing the photoelectric conversion elements shown in FIGS. 8 and 12 will be described in short.

An Si wafer is prepared, and a thick silicon oxide insulating film (element isolation region) 15 is formed by selective oxidization. The gate electrode, source, and drain of each MOS transistor and a semiconductor region 77 are formed. An insulating film 16 is formed by CVD or the like, and a contact hole is formed. Conductive films such as Al films serving as first light-shielding layers 74 and 75 and an electrode interconnection 76 are formed and etched into light-shielding and interconnection patterns. A fluid SOG precursor is spin-coated on the wafer and annealed to form a solid-state interlevel insulating film 13 as a coating insulating film. A through hole is formed in the insulating film 13, and then conductive films such as Al films serving as second light-shielding layers 70, 71, and 72 are formed and etched into light-shielding and interconnection patterns. A protective film 18 is formed by CVD or the like. MOS gate can be substituted for the transistor 81 in FIG. 14. The MOS gate can transfer all charge carriers in the semiconductor region 77 of the photodiode, so that the region 77 is completely depleted.

As described above, the fluid precursor for the insulating film applied onto the first light-shielding layers 74 and 75 and electrode interconnection 76 flows through the gaps of the first light-shielding layers. This structure can reduce variations in thickness of the interlevel insulating film, suppress shifts of the spectral sensitivity, and reduce variations in sensitivity.

According to the present invention, since the precursor of the coating insulating film flows through gaps defined by the first light-shielding layers, the difference in thickness of the insulating film can be suppressed between at least adjacent light-receiving elements within one chip.

Moreover, since the second light-shielding layer is formed to cover the gap, the portion between light-receiving elements can be shielded from light to suppress generation of unwanted photocarriers.

In this way, a photoelectric conversion element in which a uniform-thickness insulating film can be formed at relatively low cost and variations in sensitivity can be suppressed can be provided.

What is claimed is:
1. A photoelectric conversion device comprising a plurality of photoelectric conversion portions, and light-shielding means having openings formed above said photoelectric conversion portions, said light-shielding means having first light-shielding layers, and second light-shielding layers formed on said first light-shielding layers via an interlevel insulating film, said first light-shielding layers having gaps for allowing two adjacent openings to communicate with each other, and said second light-shielding layers having light-shielding portions above the gaps of said first light-shielding layers.

2. A device according to claim 1, wherein said interlevel insulating film further includes an insulating film deposited by CVD.

3. A device according to claim 1, wherein each gap has a length not less than 1/3 of a side length of the opening.

4. A device according to claim 1, wherein said interlevel insulating film is a silicon oxide film made of a fluid precursor material.

5. A device according to claim 1, wherein a protective film made of a material different from a material of said interlevel insulating film is formed on said second light-shielding layers.

6. A device according to claim 5, wherein said protective film is a silicon nitride film.

7. A device according to claim 1, wherein said first light-shielding layers have light-shielding portions formed on at least part of a peripheral circuit for processing signals from said photoelectric conversion portions.

8. A device according to claim 7, wherein the peripheral circuit is a CMOS circuit.

9. A device according to claim 1, wherein an element isolation region is formed between two adjacent photoelectric conversion portions.

10. A device according to claim 9, wherein the element isolation region includes a silicon oxide region.

11. A device according to claim 1, wherein said first and second light-shielding layers are electrically connected.

12. A device according to claim 1, wherein a transistor constituting a peripheral circuit is arranged on one side along an alignment direction of said photoelectric conversion portions, and a reference voltage line is arranged on the other side.

13. A device according to claim 1, wherein a plurality of interconnection patterns are aligned between adjacent photoelectric conversion portions.

14. A device according to claim 12, wherein said reference voltage line and said transistor constituting a peripheral circuit are electrically connected via the light-shielding portions of second light-shielding layers between adjacent photoelectric conversion portions.

15. A device according to claim 1, wherein the light-shielding portions of second light-shielding layers between adjacent photoelectric conversion portions serve as part of an interconnection.

16. An image sensor comprising said photoelectric conversion device defined in claim 1 and a light source for illuminating an original to be read by said photoelectric conversion device.

17. A sensor according to claim 16, wherein said light source generates three different color light.

18. A sensor according to claim 16, wherein said light source sequentially emits three different color light.

19. A sensor according to claim 16, wherein a surface of said photoelectric conversion device is covered with a resin.

20. A sensor according to claim 16, wherein said photoelectric conversion device is a contact image sensor for reading an image at an equal magnification.

* * * * *

UNITED STATES PATENT AND TRADEMARK OFFICE
CERTIFICATE OF CORRECTION

PATENT NO.     : 6,169,317 B1
DATED          : January 2, 2001
INVENTOR(S)    : Koji Sawada et al.

It is certified that error appears in the above-identified patent and that said Letters Patent is hereby corrected as shown below:

<u>Title page,</u>
Item [56], U.S. PATENT DOCUMENTS,
Insert:   -- 5,061,978    10/1991    Mizutani et al. --; and
          "4,972,243      11/1990    Mizutani et al."
                          should read
          -- 4,972,243    11/1990    Sagawa et al. --.

Signed and Sealed this

Ninth Day of July, 2002

Attest:

JAMES E. ROGAN
Attesting Officer    Director of the United States Patent and Trademark Office